(12) United States Patent
Mazumder et al.

(10) Patent No.: US 10,489,260 B2
(45) Date of Patent: Nov. 26, 2019

(54) APPARATUSES AND METHODS INCLUDING NESTED MODE REGISTERS

(71) Applicant: Micron Technology, Inc., Boise, ID (US)

(72) Inventors: Kallol Mazumder, Plano, TX (US); William O'Leary, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/033,076

(22) Filed: Jul. 11, 2018

(65) Prior Publication Data

US 2018/0322937 A1 Nov. 8, 2018

Related U.S. Application Data

(62) Division of application No. 15/215,423, filed on Jul. 20, 2016, now Pat. No. 10,043,587.

(51) Int. Cl.
| | |
|---|---|
| *G06F 11/267* | (2006.01) |
| *G11C 29/00* | (2006.01) |
| *H03K 19/173* | (2006.01) |
| *G11C 8/10* | (2006.01) |
| *G11C 7/22* | (2006.01) |
| *G11C 8/08* | (2006.01) |
| *G11C 29/16* | (2006.01) |
| *G11C 7/10* | (2006.01) |
| *G11C 8/06* | (2006.01) |
| *G11C 29/46* | (2006.01) |

(52) U.S. Cl.
CPC ............ *G06F 11/267* (2013.01); *G11C 7/109* (2013.01); *G11C 7/1045* (2013.01); *G11C 7/22* (2013.01); *G11C 8/08* (2013.01); *G11C 8/10* (2013.01); *G11C 29/00* (2013.01); *G11C 29/16* (2013.01); *H03K 19/1737* (2013.01); *G11C 8/06* (2013.01); *G11C 29/46* (2013.01)

(58) Field of Classification Search
CPC .... G11C 8/04; G11C 7/22; G11C 8/06; G11C 7/1006; G11C 8/10; H03K 19/1737
See application file for complete search history.

(56) References Cited

U.S. PATENT DOCUMENTS

| | | | | |
|---|---|---|---|---|
| 5,301,285 | A | * | 4/1994 | Hanawa ................. G06F 9/3822 712/212 |
| 5,437,043 | A | * | 7/1995 | Fujii .................... G06F 9/30112 712/1 |
| 2012/0204069 | A1 | * | 8/2012 | Hughes .................. G11C 29/16 714/718 |
| 2014/0043918 | A1 | * | 2/2014 | Ellis ........................ G11C 8/08 365/189.02 |
| 2018/0025760 | A1 | | 1/2018 | Mazumder et al. |

\* cited by examiner

*Primary Examiner* — Ajay Ojha
(74) *Attorney, Agent, or Firm* — Dorsey & Whitney LLP (57) ABSTRACT

Apparatuses and methods for nested mode registers to extend mode register functionality are disclosed. An example apparatus comprises a mode register configured to store address information and write data, a plurality of nested mode registers coupled to the mode register and configured to store the write data, and a decoder circuit coupled to the mode register and the plurality of nested mode registers and configured to selectively enable a nested mode register of the plurality of nested mode registers to store the write data based, at least in part, on the address information.

20 Claims, 5 Drawing Sheets

APPARATUSES AND METHODS INCLUDING NESTED MODE REGISTERS

CROSS-REFERENCE TO RELATED APPLICATION(S)

This application is a divisional of U.S. patent application Ser. No. 15/215,423, filed Jul. 20, 2016 and issued as U.S. Pat. No. 10,043,587 on Aug. 7, 2018. The afore-mentioned application, and issued patent, is incorporated by reference herein, in its entirety, and for any purposes.

BACKGROUND

Traditional memories include a number of mode registers that may be programmed through a mode register set command and typically define various controls and settings for the memory device. The number and function of the various mode registers are typically defined by a standard, such as the double data rate 4 (DDR4) standard. Mode registers are typically configured to store a limited number of bits (e.g., 14 bits) that, when read by the memory device, convey control and setting information for performing memory operations.

Access to mode registers in these devices is typically a write only operation where the source of information stored in the mode register comes from the address bus instead of the device data pins, which require an extensive tuning/calibration process involving the same mode registers to function effectively. Many such devices, such as those compliant with the DDR4 standard, include a way to indirectly read back a subset of the contents of some predefined mode registers using the Multipurpose Register function (which is itself enabled/disabled by Mode Register Settings). However, previous standards had no method to read back the data stored in the Mode Registers.

DETAILED DESCRIPTION

Certain details are set forth below to provide a sufficient understanding of embodiments of the invention. However it will be clear to one skilled in the art, that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the present invention recognize that many memory devices, such as those designed in accordance with the DDR4 or low power DDR4 (LPDDR4) standards, have a predefined number of available mode registers. It may be desirable to implement additional mode registers without departing from the specifications of the provided standard in order to take advantage of both additional functionality and standard compliance. Many standards, including DDR4 and LPDDR4, require a three bit bank address for writing to mode registers. The three bit bank address allows for up to eight different mode registers. Many standards specifically define the function of several mode registers that must be complied with. In the case of DDR4 and LPDDR4, seven mode registers are defined in the standard, leaving one mode register undefined. Embodiments disclosed herein address the above challenges and more by describing a nested mode register architecture that is accessible using the standard DDR4/LPDDR4 command protocol.

Figure 1:
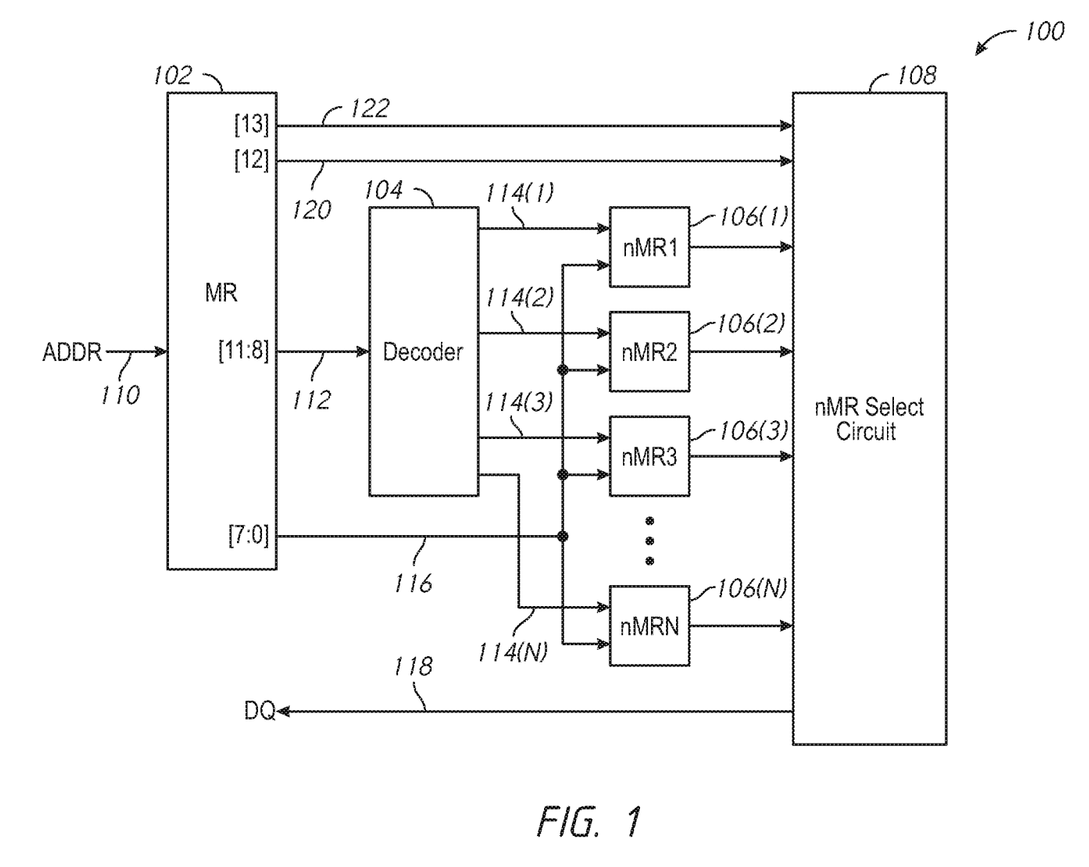
FIG. 1 is a block diagram of a mode register circuit, in accordance with an embodiment of the present invention.

FIG. 1 is a block diagram of a mode register circuit, generally designated 100, in accordance with an embodiment of the present invention. The mode register circuit generally includes a first mode register 102, a decoder circuit 104, a plurality of second mode registers 106(1)-(N), and a mode register select circuit 108.

The first mode register 102 may generally be any type of register that stores a set of mode register bits or mode register set fields. The first mode register 102 may be one of a plurality of mode registers and may be selected based on a bank address. The set of mode register bits of the first mode register 102 may be written to by, for example, a mode register set command. Mode register data may be provided to the first mode register 102 via an address bus 110 as is common in DDR4 and LPDDR4 compliant memory devices. As discussed above, the first mode register 102 may represent just one of a number of mode registers that are programmable through the address bus 110. For example, in embodiments compliant with the DDR4 or LPDDR4 standard, the first mode register 102 may be the eighth defined mode register, where the other seven mode registers are defined in compliance with the relevant standard.

The first mode register 102 may generally have any number of addressable mode register bits. For example, in the embodiment of FIG. 1, the first mode register 102 includes a set of 14 mode register bits (e.g., [13:0]) that may be written to using the address bus 110. For example, during a mode register set command, mode register set data may be provided to the first mode register 102 via the address bus 110. The mode register set data may include various types of information, such as mode register data to be stored in one or more of the second mode registers 106(1)-(N), address information to identify one or more of the second mode registers 106(1)-(N), information related to selecting a subset of second mode registers 106(1)-(N) from which to provide mode register data, and information indicative of whether to provide mode register data from second mode registers 106(1)-(N) or MPR data. The set of mode register bits may be grouped together into a number of subsets, where each subset serves a different purpose. For example, mode register bits [7:0] may be a subset of the set of mode register bits configured to be written to with mode register data. The mode register data may then be written to one or more second mode registers (e.g., second mode registers 106(1)-(N)). Mode register bits [11:8] may be a subset of mode register bits configured to store mode register address information for identifying the one or more second mode registers 106(1)-(N) to which the mode register data is to be written. Mode register address information may be written to the mode register bits [11:8] responsive to a mode register set command. Mode register bit [12] may be a subset of the set of mode register bits configured to store mode register selection information for selecting a subset of second mode registers 106(1)-(N). The selected subset of second mode registers 106(1)-(N) provides the respective mode register data responsive to the nested mode register circuit 100. Mode register bit [13] may be a subset of the set of mode register bits configured to store mode register set data indicative of whether MPR data or mode register data from a subset of the second mode registers 106(1)-(N) should be provided on the data bus 118 responsive to a read command. When the mode register data bit [13] is set to a first value (e.g., logical low), standard MPR data may be provided on the data bus 118 responsive to a read command. When the mode register data bit [13] is set to a second value (e.g., logical high), mode register data from a subset of the second mode registers 106(1)-(N) may be provided on the data bus 118 responsive to a read command.

Those skilled in the art will appreciate that the particular mode register bit assignments are merely an example, and that alternative mode register bit assignments may be implemented without departing from the scope of this application. Additionally, different numbers of bits may be assigned to the different subsets of bits. For example, three mode register bits may be defined to store the mode register address information instead of the four mode register bits as described above.

The decoder circuit 104 may be a circuit configured to receive mode register address information via a mode register address bus 112, identify one or more of the second mode registers 106(1)-(N) based on the mode register address information, and selectively enable the identified one or more second mode registers 106(1)-(N) to be written with mode register data based on the address information. The decoder circuit 104 may include, for example, a multiplexer configured to receive the mode register address information and to provide an enable signal to one or more of the second mode registers 106(1)-(N) via respective mode register enable lines 114(1)-(N). For example, the decoder circuit may receive mode register address information '0001' (corresponding to second mode register 106(2)) which is stored in mode register bits [11:8] of the first mode register 102 via the mode register address bus 112, and provide an active enable signal to the second mode register 106(2) via the mode register enable line 114(2). The remaining second mode registers 106(1) and 106(3)-106(N) may be provided inactive enable signals over mode register enable lines 114(1) and 114(3)-(N) respectively. The activated mode register (e.g., second mode register 106(2)) may store the mode register data stored in mode register bits [7:0] of the first mode register 102 and provided on a mode register data bus 116.

The second mode registers 106(1)-(N) may generally be any type of register that are configured to store a number of bits. The second mode registers 106(1)-(N) may be considered "nested" within the first mode register 102 because they all may be accessed (e.g., written to) through a single first mode register 102 defined for the purpose of accessing the second mode registers 106(1)-(N). Accordingly, the second mode registers 106(1)-(N) are "nested" within the first mode register 102. In various embodiments, the second mode registers 106(1)-(N) may be configured to store eight bits each. The second mode registers 106(1)-(N) may each be coupled to the first mode register 102 by the mode register data bus 116. The mode register write data, which is stored in mode register bits [7:0] of the first mode register 102, may be provided to an enabled second mode register 106(1)-(N) via the mode register data bus 116. As discussed above, each of the second mode registers 106(1)-(N) may be addressable by mode register bits [11:8] of the first mode register 102. As previously described, the mode register bits [11:8] may store mode register address information identifying a mode register of the second mode registers 106(1)-(N). In such embodiments, there may be sixteen second mode registers 106(1)-(N) that may be individually selected based on the 4 mode register bits [11:8]. 106(1) The second mode registers 106(1)-(N) may store information associated with the one or more controls or settings for a memory device. For example, the controls or settings may include hidden refresh mode enablement, decryption enablement, status channel control, cache control, cache fetch size, latency programming, and internal clock control, among others.

The mode register select circuit 108 may generally be a circuit configured to select one or more of the second mode registers 106(1)-(N) and to provide mode register data on the data bus 118 for each of the selected second mode registers 106(1)-(N). In various embodiments, the mode register select circuit 108 may be configured to selectively provide mode register data stored on half of the second mode registers 106(1)-(N) at a time. The mode register data stored in the second mode registers 106(1)-(N) may be provided responsive to setting the mode register bit [13] of the first mode register 102 to a particular logical value (e.g., logical high). The first mode register 102 may be coupled to the mode register select circuit 108 via select signal lines 120 and 122, which provide the values stored in mode register bits [12] and [13] to the mode register select circuit 108, respectively, in the form of first and second select signals, respectively. As discussed above, the value stored in mode register bit [12] may be indicative of a subset of the second mode registers 106(1)-(N) to be provided on the data bus 118. The value stored in mode register bit [13] may be indicative of the mode register circuit 100 being set to provide mode register data stored on the subset of second mode registers 106(1)-(N) indicated by the value stored in data bit [12]. The select circuit is described in further detail below with respect to FIG. 3.

Figure 2:
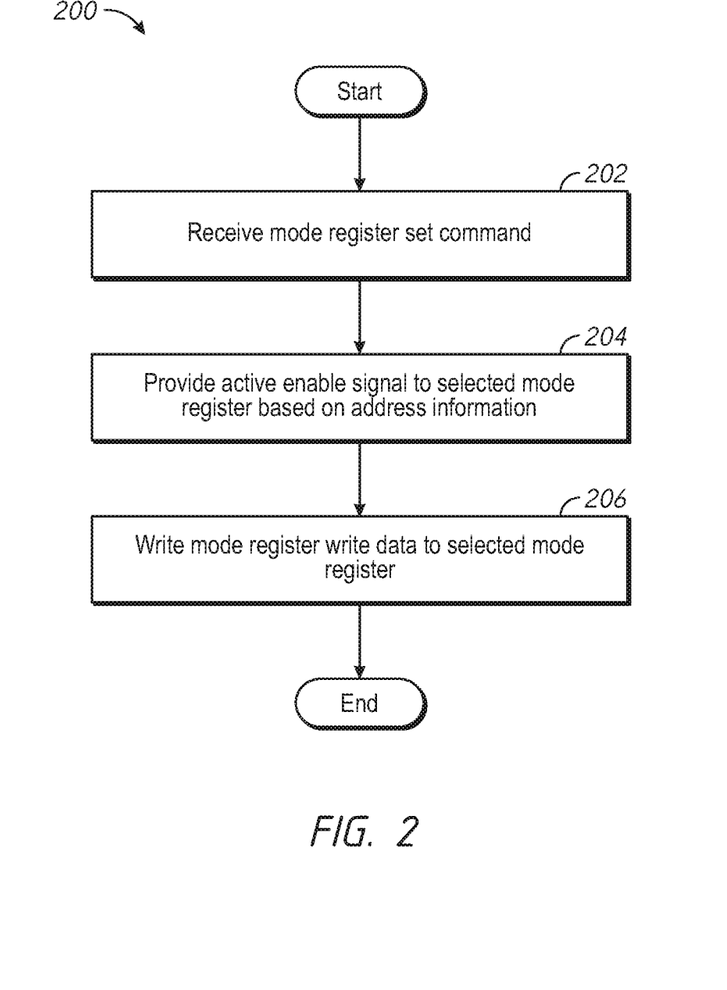
FIG. 2 is a flowchart illustrating a mode register write operation in accordance with the embodiment of FIG. 1.

FIG. 2 is a flowchart illustrating operations for storing mode register data in one or more of the second mode registers, in accordance with the embodiment of FIG. 1. In operation 202, the mode register circuit 100 receives a mode register set command, Mode register data may be provided to the first mode register 102 via the address bus 110 in conjunction with the mode register set command. As described above with respect to FIG. 1, the mode register set data may include a variety of information, including mode register data to be stored in one or more of the second mode registers 106(1)-(N) and address information identifying one or more of the second mode registers 106(1)-(N).

Based on the address information provided in the mode register set data, the mode register circuit 100 provides an active enable signal to a selected second mode register 106 in operation 204. As discussed above, a subset of the mode register bits [13:0] (e.g., mode register bits [11:8]) may be written with mode register address information indicative of which of the second mode registers 106(1)-(N) is to be written with the mode register write data. Based on the mode register address information, the mode register circuit 100 may identify the selected second mode registers 106(1)-(N) by decoding the address information with the decoder circuit 104 and provide an active enable signal to the selected second mode registers 106(1)-(N) while providing an inactive enable signal to the remaining second mode registers 106(1)-(N). In operation 206, the mode register circuit 100 writes the mode register write data to the selected second mode registers 106(1)-(N). For example, mode register write data may be received with the mode register data and stored in a subset of the mode register bits [13:0] (e.g., mode register bits [7:0]). Responsive to the active enable signal, the mode register write data may be written to the mode register bits of the selected second mode registers 106(1)-(N).

Figure 3:
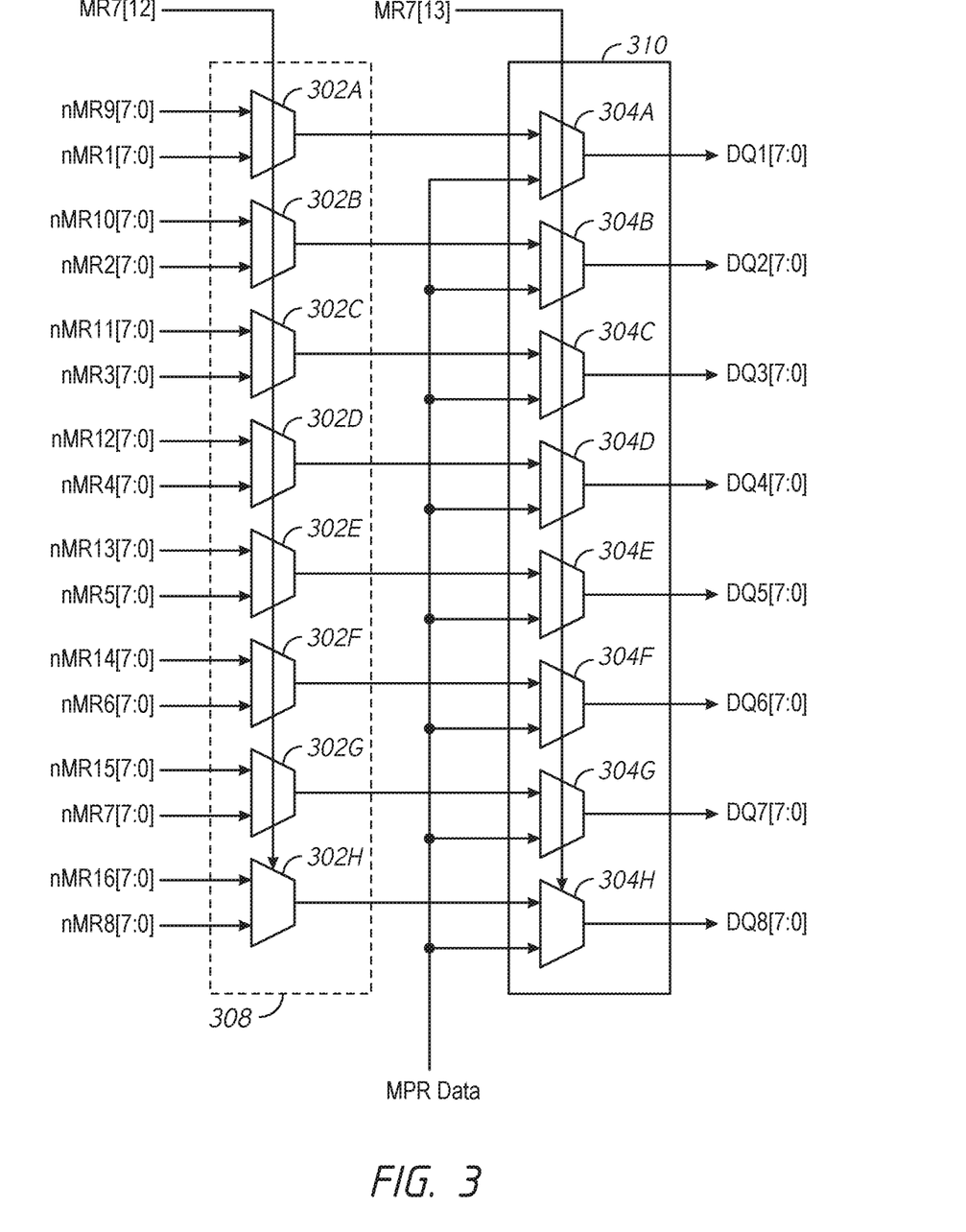
FIG. 3 is a schematic diagram of a mode register select circuit and a modified MPR circuit, in accordance with an embodiment of the present invention.

FIG. 3 is a schematic diagram of a mode register select circuit, generally designated 308, and a modified MPR circuit, generally designated 310 in accordance with an embodiment of the present invention. In various embodiments, the mode register select circuit 308 may be implemented as the mode register select circuit 108 of FIG. 1. In general, the mode register select circuit 308 and the modified MPR circuit 310 may provide mode register data stored in a subset of the second mode registers 106(1)-(N) on the data bus 118 responsive to a read command.

The mode register select circuit 308 generally includes a first plurality of multiplexers 302A-H. The modified MPR circuit 310 generally includes a second plurality of multiplexers 304A-H. Each of the multiplexers in the first plurality of multiplexers 302A-H may be coupled to a pair of the second mode registers 106(1)-(N). For example, in an embodiment with 16 mode registers (designated second mode registers 106(1)-(16)), the multiplexer 302A may be coupled to second mode registers 106(1) and 106(9), the multiplexer 302B may be coupled to second mode registers 106(2) and 106(10), and so on. Each multiplexer of first plurality of multiplexers 302A-N may have a select input coupled to the first mode register 102 and configured to receive a signal based on the value stored in mode register bit [12] of the first mode register 102. As discussed above, the value stored in mode register bit [12] may be set in order to select a subset of the second mode registers 106(1)-(N) to read. For example, if mode register bit [12] is set to a first value (e.g., logically high), then a first subset of the second mode registers 106(1)-(N) may be read. If mode register bit [12] is set to a second value (e.g., logically low), then a second subset of the second mode registers 106(1)-(N) may be read. In the embodiment of FIG. 2, if mode register bit [12] is set to a first value, then the selected subset includes second mode registers 106(1)-(8), and if mode register bit [12] is set to a second value, the selected subset includes nested second mode registers 106(9)-(16). The bits stored in the selected subset of nested second mode registers 106(1)-(N) may be provided to respective output terminals of the first plurality of multiplexers 302A-H.

The output terminal of each multiplexer of the first plurality of multiplexers 302A-H may be coupled to a first input terminal of a corresponding multiplexer of the second plurality of multiplexers 304A-H. For example, the output terminal of the multiplexer 302A may be coupled to a first input terminal of the multiplexer 304A. In some embodiments, the second input terminals of the second plurality of multiplexers 304A-H may be configured to provide multi-purpose register (MPR) read data as the standard read data. The particular contents of the MPR read data may be defined in a standard specification, such as the DDR4 standard. For example, the standard read data may include a string of logically low values or logically high values.

Each multiplexer of the second plurality of multiplexers 304A-H may have a select input terminal that is coupled to mode register bit [13] of the first mode register 102. Based on a first value being stored in bit [13], the second plurality of multiplexers 304A-H may be configured to provide the standard read data. Alternatively, when mode register bit [13] is set to a second value, the second plurality of multiplexers 304A-H may be configured to provide the data received from the first plurality of multiplexers 302A-H. The output of the second plurality of multiplexers 304A-H may be provided serially on the data bus 118, which may be an 64-bit wide bus. For example, the output of the multiplexer 304A may be provided on DQ1, the output of the multiplexer 304B may be provided on DQ2, etc. The data may be provided, for example, as an eight bit burst for each of the selected second mode registers 106. That is, the eight bits stored in the second mode register 106(1) may be provided as an eight bit burst on DQ1, the eight bits stored in the second mode register 106(2) may be provided as an eight bit burst on DQ2 of the 64-bit wide data bus 118, and so on. By setting mode register bit [13] to the second value, and setting mode register bit [12] to indicate a particular subset of second mode registers 106(1)-(N) to be read, the mode register select circuit 108 may provide the contents of the selected subset of the second mode registers 106(1)-(N) on the data bus 118. Those skilled in the art will appreciate that the particular implementation shown in FIG. 4 is intended only to be an example and that in various embodiments; other implementations may be possible without departing from the scope of the present invention.

Figure 4:
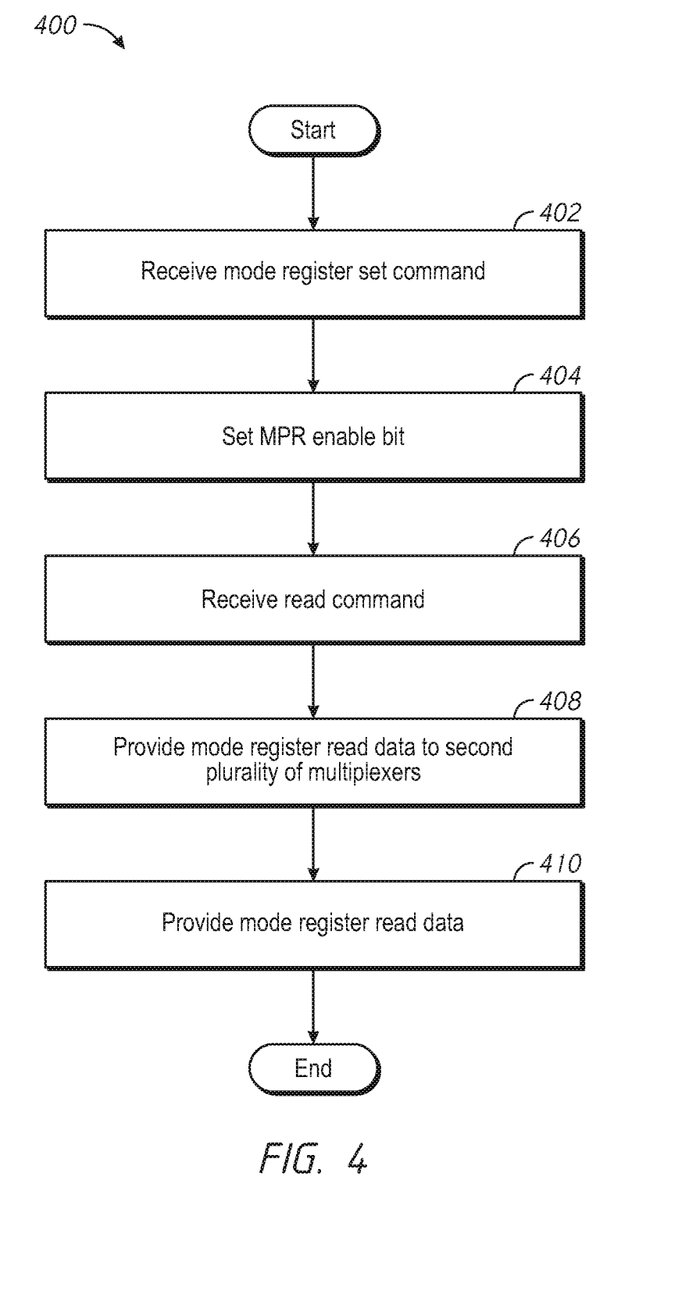
FIG. 4 is a flowchart illustrating a mode register read operation, in accordance with the embodiment of FIG. 3.

FIG. 4 is a flowchart, generally designated 400, illustrating operational steps for returning data from one or more of the second mode registers 106(1)-(N), in accordance with the embodiments of FIGS. 1 and 3. In operation 402, the mode register circuit 100 receives a mode register set command. In various embodiments, mode register set data may be stored at least in mode register bits [12] and [13]. In operation 404, an MPR data bit is set. In various embodiments, the memory device 104 may have a programmable mode register that, when set to a particular value, causes the memory device to return MPR data on the data bus 118. The MPR enable bit may be located in a mode register other than the first mode register 102. In operation 406, the mode register circuit 100 receives a read command. Responsive to the read command, the mode register circuit 100 may provide data on the data bus 118. What data is returned depends on the values stored in bits [12] and [13] in operation 402. For example, mode register bit [12] may store a value indicative of a subset of the second mode registers 106(1)-(N) to read. As shown in FIG. 3, the value stored in mode register bit [12] may be provided to a select input of the first plurality of multiplexers 302A-H of the mode register select circuit 308. Based on the value of mode register bit [12], a first or second subset of the mode registers is selected to be read by the first plurality of multiplexers 302A-H. In operation 406, the mode register select circuit 308 provides data from the selected subset of second mode registers 106(1)-(N) to the second plurality of multiplexers 304. In operation 408, the mode register circuit 100 may provide the mode register read data from the selected subset of the second mode registers 106(1)-(N) on the data bus 118. The value of mode register bit [13] may be provided to the select input of the second plurality of multiplexers 304A-H of the modified MPR circuit 310. The value stored in bit [13] may be indicative of what information to provide on the data bus 118. For example, if bit [13] is logically low, then standard MPR data may be provided on the data bus 118. Alternatively, if bit [13] is logically high, then the mode register data received from the mode register select circuit 310 may be provided on the data bus 118. For example, the mode register read data may be provided serially on a 64-bit wide data bus 118 in eight 8-bit bursts as described above with respect to FIG. 3.

Figure 5:
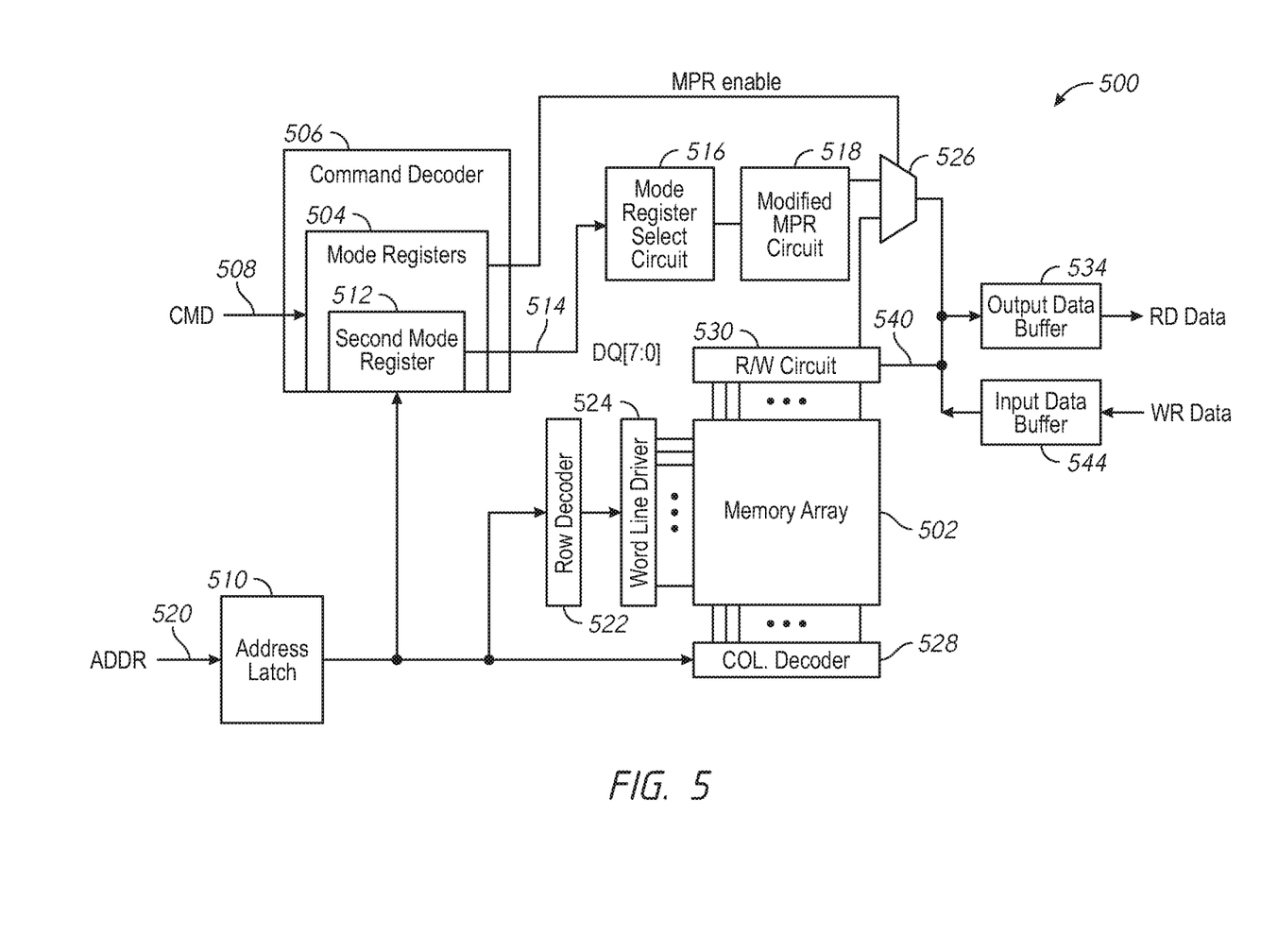
FIG. 5 is a block diagram of a memory including a mode register circuit, in accordance with an embodiment of the present invention.

FIG. 5 is a block diagram of a memory 500, in accordance with an embodiment of the invention. The memory 500 may include an array 502 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 500 includes a command decoder 506 that may receive memory commands through a command bus 508 and provide (e.g., generate) corresponding control signals within the memory 500 to carry out various memory operations. For example, the command decoder 506 may respond to memory commands provided to the command bus 508 to perform various operations on the memory array 502. In particular, the command decoder 506 may be used to provide internal control signals to read data from and write data to the memory array 502. Row and column address signals may be provided (e.g., applied) to an address latch 510 in the memory 500 through the address bus 520. The address latch 510 may then provide (e.g., output) address information to row decoder 522 and column decoder 528. In various embodiments, the address bus 520 and the command bus 508 may be implemented as a single command/address bus.

The command decoder 506 may include mode registers 504, which may provide access to one or more second registers 512 that may be written to using a mode register set command received on the command/address bus 508, as described above with respect to FIGS. 1-2. The second mode registers 512 may be implemented as the first mode register 102 of FIG. 1, such that the mode register circuit 512 is accessible by programming a particular mode register of the mode registers 504. Data from the mode register circuit 512 may be provided, for example, to various components, circuits, and/or blocks (not shown) for implementing various functionality in the memory 500. Mode register data stored in the second mode registers 512 may be provided to the output data buffer 534 to be provided as read data (RD data). For example, mode register data may be provided to the mode register select circuit 516 which selects a subset of the second mode registers 512 based on the value stored in mode register bit [12], as described above with respect to FIG. 3. Mode register data from the selected subset is provided to the modified MPR circuit 518, which provides one of the mode register data from the selected subset of second mode registers 512 or standard MPR data. The output of the modified MPR circuit 518 may be provided to a multiplexer 526 which is configured to provide one of the output of the modified MPR circuit 518 and read data from the memory array 502 via the R/W Circuit 530 to the output data buffer 534 responsive to the value stored in the MPR enable bit of one of the mode registers 508, as described above with respect to FIG. 4. In various embodiments, when the MPR enable bit is set to an active value, the multiplexer 526 may be configured to provide data from the modified MPR circuit 518 to the output data buffer 534. Alternatively, when the MPR enable bit is set to an inactive value, the multiplexer 526 may be configured to provide read data from the R/W circuit 530.

The address latch 510 may provide row and column addresses to a row address decoder 522 and a column address decoder 528, respectively. The column address decoder 528 may select bit lines extending through the array 502 corresponding to respective column addresses. The row address decoder 522 may be connected to a word line driver 524 that activates respective rows of memory cells in the array 502 corresponding to received row addresses. The selected data line (e.g., a bit line or bit lines) corresponding to a received column address may be coupled to a read/write circuitry 530 to provide read data to an output data buffer 534 via an input-output data path 540. Write data may be provided to the memory array 502 through an input data buffer 544 and the memory array read/write circuitry 530.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. A method comprising:
   storing, in a mode register, mode register data and address information;
   decoding, with a decoder circuit, the address information from the mode register to identify a nested mode register; and
   responsive to identifying the nested mode register, storing the mode register data from the mode register in the nested mode register.

2. The method of claim 1, further comprising:
   responsive to identifying the nested mode register, providing an enable signal to the nested mode register.

3. The method of claim 1, wherein the set of mode register data are stored in the mode register responsive to receiving a mode register set command.

4. The method of claim 1, further comprising:
   storing select information in the mode register, wherein the select information indicates that the mode register data is to be written to the identified nested mode register.

5. The method of claim 1, further comprising:
   storing second select information in the mode register; and
   providing the mode register data from the identified nested mode register based, at least in part, on the second select information.

6. The method of claim 5, wherein the mode register data is provided in conjunction with additional mode register data from a plurality of additional nested mode registers.

7. The method of claim 1, further comprising:
   providing, by a select circuit coupled to the nested mode register, the mode register data stored in the nested mode register.

8. The method of claim 7, wherein the mode register data is provided in conjunction with additional mode register data from a plurality of additional nested mode registers responsive to second select information stored in the mode register.

9. The method of claim 1, wherein the mode register data is provided in conjunction with additional mode register data from a plurality of additional nested mode registers coupled in pairs to respective multiplexers of a plurality of multiplexers.

10. The method of claim 9, wherein a select circuit coupled to the mode register includes the plurality of multiplexers configured to provide the mode register data in conjunction with additional mode register data responsive to second select information received from the mode register.

11. A method comprising:
storing, in a mode register, mode register address information and mode register data;
decoding, with a decoder circuit, the mode register address information from the mode register to identify a second mode register of a plurality of second mode registers;
providing an enable signal to the identified second mode register; and
responsive to the enable signal, storing the mode register data in the identified second mode register.

12. The method of claim 11, further comprising:
storing, in the mode register, select information, wherein a select circuit is configured to provide the mode register data from the identified mode register responsive to the select information.

13. The method of claim 12, further comprising:
providing the mode register data stored on a subset of the plurality of second mode registers responsive to the select information.

14. The method of claim 13, wherein the subset of the plurality of second mode registers includes the identified mode register.

15. The method of claim 13, he mode register data is provided on a data bus of a memory device.

16. The method of claim 11, wherein each second mode register of the plurality of second mode registers is configured to store eight bits.

17. A method comprising:
receiving, by a first mode register, a mode register set command;
storing mode register data and mode register address information in the first mode register based on the received mode register set command;
selectively enabling, by a decoder circuit responsive to the mode register address information from the first mode register, a second mode register among a plurality of second mode registers to store the mode register data.

18. The method of claim 17, wherein the mode register data stored in the second mode register is provided by a select circuit coupled to the second mode register.

19. The method of claim 18, wherein the mode register data is provided by the select circuit based on selection information stored in the first mode register.

20. The method of claim 17, wherein the mode register data stored in the second mode register is provided by the select circuit by using a plurality of multiplexers included in the select circuit.

* * * * *

UNITED STATES PATENT AND TRADEMARK OFFICE
CERTIFICATE OF CORRECTION

PATENT NO. : 10,489,260 B2  
APPLICATION NO. : 16/033076  
DATED : November 26, 2019  
INVENTOR(S) : Kallol Mazumder et al.

Page 1 of 1

It is certified that error appears in the above-identified patent and that said Letters Patent is hereby corrected as shown below:

In the Claims

| | Reads | Should Read |
|---|---|---|
| Column 10, Line 4 Claim 15 | "he mode register data is" | --wherein the mode register data is-- |

Signed and Sealed this  
Fourth Day of February, 2020

Andrei Iancu  
*Director of the United States Patent and Trademark Office*